United States Patent
Cheng et al.

(10) Patent No.: US 12,419,066 B2
(45) Date of Patent: Sep. 16, 2025

(54) SEMICONDUCTOR STRUCTURES AND MANUFACTURING METHODS THEREOF

(71) Applicant: ENKRIS SEMICONDUCTOR, INC., Jiangsu (CN)

(72) Inventors: Kai Cheng, Jiangsu (CN); Liyang Zhang, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 613 days.

(21) Appl. No.: 17/790,885

(22) PCT Filed: Apr. 15, 2021

(86) PCT No.: PCT/CN2021/087486
§ 371 (c)(1),
(2) Date: Jul. 5, 2022

(87) PCT Pub. No.: WO2022/217538
PCT Pub. Date: Oct. 20, 2022

(65) Prior Publication Data
US 2023/0290886 A1    Sep. 14, 2023

(51) Int. Cl.
*H10D 8/60* (2025.01)
*H10D 8/01* (2025.01)
*H10D 62/85* (2025.01)

(52) U.S. Cl.
CPC .......... *H10D 8/60* (2025.01); *H10D 8/051* (2025.01); *H10D 62/8503* (2025.01)

(58) Field of Classification Search
CPC ........ H01L 23/49575; H01L 23/49503; H10D 64/254; H10D 30/477; H10D 30/63; H10D 62/824
See application file for complete search history.

(56) References Cited

U.S. PATENT DOCUMENTS

2006/0108659 A1    5/2006  Yanagihara et al.
2011/0127581 A1*   6/2011  Bethoux ............... H01L 21/187
                                                117/106
(Continued)

FOREIGN PATENT DOCUMENTS

CN    102388433 A    3/2012
CN    103441155 A    12/2013
(Continued)

OTHER PUBLICATIONS

TW Patent Office, Office Action Issued in Application No. 111113417, Mar. 28, 2023, 12 pages. (Submitted with Machine Translation).
(Continued)

*Primary Examiner* — Brian Turner
(74) *Attorney, Agent, or Firm* — The Small Patent Law Group LLC; Christopher R. Carroll (57) ABSTRACT

Semiconductor structures and manufacturing methods thereof. A semiconductor structure includes: a first epitaxial layer; a bonding layer, on first epitaxial layer and provided with a first through-hole exposing first epitaxial layer; a silicon substrate, on a side of bonding layer away from first epitaxial layer, first epitaxial layer and the silicon substrate being bonded through the bonding layer; a through-silicon-via, in silicon substrate, through-silicon-via communicating with first through-hole; a second epitaxial layer, on first epitaxial layer exposed by first through-hole; a first electrode, on a side of first epitaxial layer away from bonding layer, and electrically coupled with first epitaxial layer; a second electrode, on a side of second epitaxial layer away from first epitaxial layer, and electrically coupled with second epitaxial layer.

19 Claims, 4 Drawing Sheets

(56) References Cited

U.S. PATENT DOCUMENTS

| | | | |
|---|---|---|---|
| 2012/0003823 A1 | 1/2012 | Sasaki et al. | |
| 2013/0143392 A1* | 6/2013 | Romano | H10D 30/675 |
| | | | 257/E21.09 |
| 2014/0312453 A1* | 10/2014 | Harame | H10D 62/137 |
| | | | 257/484 |
| 2015/0249064 A1* | 9/2015 | Horibe | H01L 24/11 |
| | | | 257/737 |
| 2016/0118377 A1 | 4/2016 | Moens et al. | |
| 2017/0077272 A1 | 3/2017 | Kubo | |
| 2020/0058804 A1* | 2/2020 | Hirabayashi | H01L 21/02414 |
| 2021/0175337 A1 | 6/2021 | Tsunami | |
| 2021/0305190 A1* | 9/2021 | Choi | H01L 23/562 |

FOREIGN PATENT DOCUMENTS

| | | | |
|---|---|---|---|
| CN | 105140122 A | 12/2015 | |
| CN | 107359207 A | 11/2017 | |
| CN | 111656498 A | 9/2020 | |
| EP | 3540784 A1 | 9/2019 | |
| JP | 2008124217 A | 5/2008 | |
| TW | 201101497 A | 1/2011 | |
| WO | 2018139557 A1 | 8/2018 | |
| WO | 2019003861 A1 | 1/2019 | |

OTHER PUBLICATIONS

ISA State Intellectual Property Office of the People's Republic of China, International Search Report Issued in Application No. PCT/CN2021/087486, Aug. 20, 2021, WIPO, 5 pages.

ISA State Intellectual Property Office of the People's Republic of China, Written Opinion of the International Searching Authority Issued in Application No. PCT/CN2021/087486, Aug. 20, 2021, WIPO, 5 pages. (Submitted with Machine/Partial Translation).

* cited by examiner

SEMICONDUCTOR STRUCTURES AND MANUFACTURING METHODS THEREOF

CROSS REFERENCE TO RELATED APPLICATION

This application is a US National Phase of a PCT Application No. PCT/CN2021/087486, filed on Apr. 15, 2021, the contents of which are incorporated herein by reference in its entirety.

TECHNICAL FIELD

The present disclosure relates to the field of semiconductor technology, and in particular, to semiconductor structures and manufacturing methods thereof.

BACKGROUND

With a development of science and technology, semiconductor devices have attracted more and more attention.

Schottky Barrier Diode (SBD) is an important semiconductor device. A structure of SBD is a metal-semiconductor junction formed by a contact between metal and semiconductor epitaxial layer. Due to the SBD having relatively simple structure, the SBD is popular in a power market and has attracted an attention of industry. However, the SBD has a low withstand voltage performance.

SUMMARY

An object of the present disclosure is to provide a semiconductor structure and a method of manufacturing the semiconductor structure, which can improve a withstand voltage performance of the semiconductor device.

According to an aspect of the present disclosure, there is provided a semiconductor structure including:
  a first epitaxial layer;
  a bonding layer, disposed on the first epitaxial layer, and provided with a first through-hole exposing the first epitaxial layer;
  a silicon substrate, disposed on a side of the bonding layer away from the first epitaxial layer, the first epitaxial layer and the silicon substrate being bonded through the bonding layer;
  a through-silicon-via in the silicon substrate, the through-silicon-via communicating with the first through-hole;
  a second epitaxial layer, disposed on the first epitaxial layer exposed by the first through-hole;
  a first electrode, disposed on a side of the first epitaxial layer away from the bonding layer, and electrically coupled with the first epitaxial layer;
  a second electrode, disposed on a side of the second epitaxial layer away from the first epitaxial layer, and electrically coupled with the second epitaxial layer.

In some embodiments, the second epitaxial layer is a lightly doped epitaxial layer, and a doping concentration of the second epitaxial layer is less than a doping concentration of the first epitaxial layer.

In some embodiments, the second epitaxial layer includes:
  a heavily doped layer, disposed on the first epitaxial layer exposed by the first through-hole, a doping concentration of the heavily doped layer being less than or equal to the doping concentration of the first epitaxial layer;
  a lightly doped layer, disposed on a side of the heavily doped layer away from the first epitaxial layer, and a doping concentration of the lightly doped layer being less than the doping concentration of the heavily doped layer.

In some embodiments, the first electrode is an ohmic contact electrode, and the second electrode is a Schottky contact electrode.

In some embodiments, a depth-to-width ratio of the through-silicon-via is greater than 1.

In some embodiments, the silicon substrate is monocrystalline silicon with <100> orientation.

In some embodiments, a material of the first epitaxial layer is same as a material of the second epitaxial layer, and includes at least one of GaN, AlN, AlGaN, InGaN or AlInGaN.

In some embodiments, the semiconductor structure further includes:
  a first dielectric layer, disposed on a side of the silicon substrate away from the bonding layer, and provided with a second through-hole communicating with the through-silicon-via, a partial area of the second electrode covering the first dielectric layer, and the second electrode passing through the second through-hole to contact the second epitaxial layer.

In some embodiments, the first through-hole and the through-silicon-via are fully filled with the second epitaxial layer, and a surface of the second epitaxial layer away from the first epitaxial layer is flush with a surface of the silicon substrate away from the bonding layer.

In some embodiments, a sidewall of the through-silicon-via has a second dielectric layer.

According to an aspect of the present disclosure, there is provided a method of manufacturing a semiconductor structure, including:
  providing a silicon substrate and providing a first epitaxial layer disposed on a support substrate;
  providing a bonding layer to bond the first epitaxial layer and the silicon substrate together;
  forming a through-silicon-via on the silicon substrate, forming a first through-hole exposing the first epitaxial layer on the bonding layer, and the first through-hole communicating with the through-silicon-via;
  forming a second epitaxial layer on the first epitaxial layer exposed by the first through-hole;
  removing the support substrate, forming a first electrode on a side of the first epitaxial layer away from the bonding layer, and the first electrode being electrically coupled with the first epitaxial layer;
  forming a second electrode on a side of the second epitaxial layer away from the first epitaxial layer, and the second electrode being electrically coupled with the second epitaxial layer.

In some embodiments, the second epitaxial layer is a lightly doped epitaxial layer, and a doping concentration of the second epitaxial layer is less than a doping concentration of the first epitaxial layer.

In some embodiments, forming the second epitaxial layer includes:
  forming a heavily doped layer on the first epitaxial layer exposed by the first through-hole, a doping concentration of the heavily doped layer being less than or equal to a doping concentration of the first epitaxial layer; and
  forming a lightly doped layer on a side of the heavily doped layer away from the first epitaxial layer, a doping concentration of the lightly doped layer being less than the doping concentration of the heavily doped layer.

In some embodiments, a depth-to-width ratio of the through-silicon-via is greater than 1.

In some embodiments, before forming the second electrode, the method of manufacturing the semiconductor structure further includes:

forming a first dielectric layer on a side of the silicon substrate away from the bonding layer, the first dielectric layer being provided with a second through-hole communicating with the through-silicon-via, and a partial area of the second electrode covering the first dielectric layer, and the second electrode passing through the second through-hole to contact the second epitaxial layer.

According to the semiconductor structure and the method of manufacturing the semiconductor structure of the present disclosure, the silicon substrate is bonded on the first epitaxial layer. Due to a thickness of the silicon substrate is relatively thick, a depth-to-width ratio of the through-silicon-via formed in the silicon substrate is generally large. When the second epitaxial layer is formed by epitaxial growing the first epitaxial layer, dislocations in the second epitaxial layer are bent and annihilated in a sidewall or inside of the through-silicon-via, therefore a second epitaxial layer with a low dislocation density is formed, which improves a quality of the second epitaxial layer and improves a voltage withstand performance of the semiconductor device.

Description of reference numerals: first epitaxial layer 1; bonding layer 2; first through-hole 201; silicon substrate 3; through-silicon-via 301; first electrode 4; second epitaxial layer 5; heavily doped layer 501; lightly doped layer 502; support substrate 6; first dielectric layer 7; second through-hole 701; second electrode 8; second dielectric layer 9.

DETAILED DESCRIPTION OF THE EMBODIMENTS

Various embodiments will be described in detail herein, examples of which are illustrated in the accompanying drawings. When the following descriptions involve the drawings, like numerals in different drawings represent like or similar elements unless stated otherwise. The embodiments described in the following embodiments do not represent all embodiments consistent with the present disclosure. On the contrary, they are merely examples consistent with some aspects of the present disclosure as recited in detail in the appended claims.

First Embodiment

Figure 1:
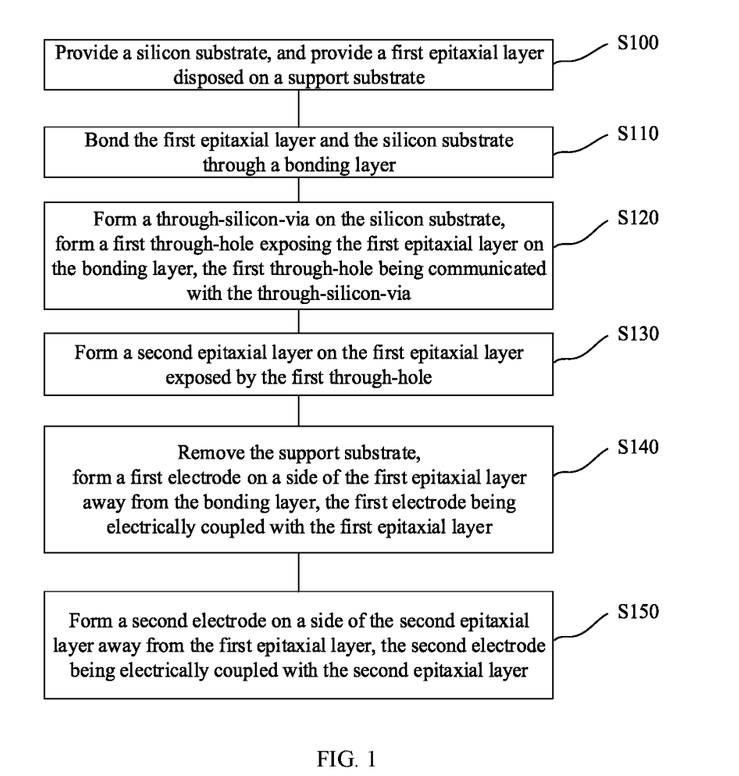
FIG. 1 is a flowchart of a method of manufacturing a semiconductor structure according to a first embodiment of the present disclosure.

The first embodiment of the present disclosure provides a semiconductor structure and a method of manufacturing the semiconductor structure. As shown in FIG. 1, the method of manufacturing the semiconductor structure according to the first embodiment can include steps S100 to S150.

At step S100, a silicon substrate is provided, and a first epitaxial layer disposed on a support substrate is provided.

At step S110, the first epitaxial layer and the silicon substrate are bonded through a bonding layer.

At step S120, a through-silicon-via is formed on the silicon substrate, a first through-hole exposing the first epitaxial layer is formed on the bonding layer, and first through-hole is communicated with the through-silicon-via.

At step S130, a second epitaxial layer is formed on the first epitaxial layer exposed by the first through-hole.

At step S140, the support substrate is removed, a first electrode is formed on a side of the first epitaxial layer away from the bonding layer, and the first electrode is electrically coupled with the first epitaxial layer.

At step S150, a second electrode is formed on a side of the second epitaxial layer away from the first epitaxial layer, and the second electrode is electrically coupled with the second epitaxial layer.

Figure 3:
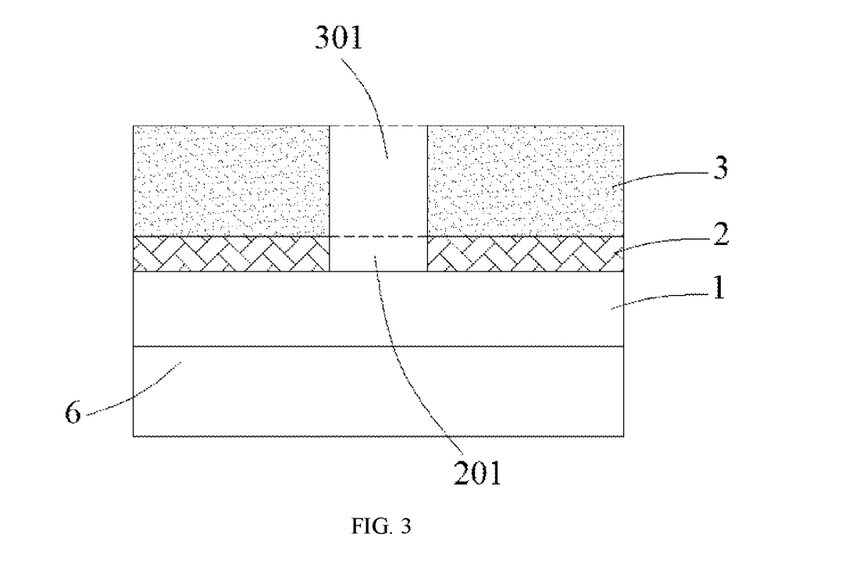
FIG. 3 is a schematic diagram of a structure obtained after a completion of step 120 in the method of manufacturing the semiconductor structure according to the first embodiment of the present disclosure.
Figure 6:
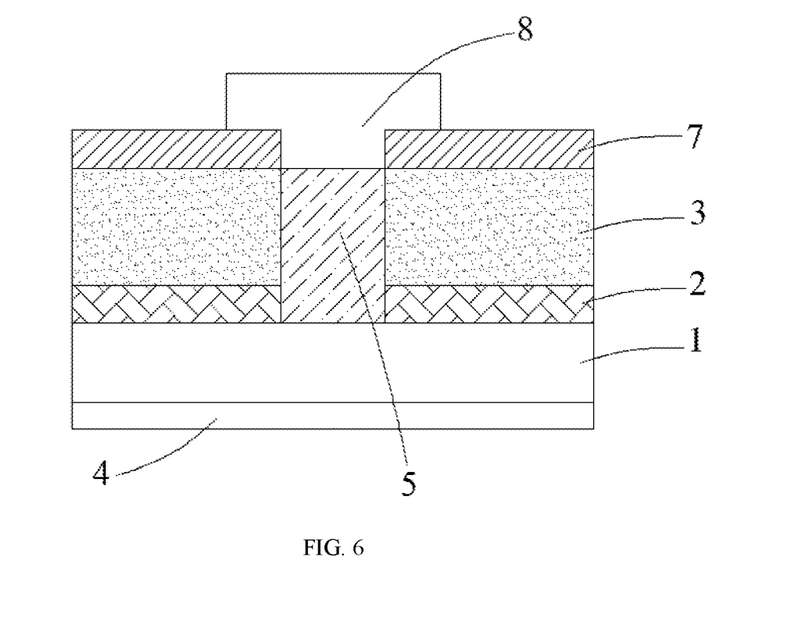
FIG. 6 is a schematic diagram of a structure obtained after a completion of step 150 in the method of manufacturing the semiconductor structure according to the first embodiment of the present disclosure.

With the method of manufacturing the semiconductor structure in this embodiment, as shown in FIG. 3 and FIG. 6, the silicon substrate 3 is bonded on the first epitaxial layer 1. Due to a thickness of the silicon substrate 3 is relatively thick, a depth-to-width ratio of the through-silicon-via 301 formed in the silicon substrate 3 is generally large. When the second epitaxial layer 5 is formed by epitaxially growing the first epitaxial layer 1, dislocations in the second epitaxial layer 5 are bent and annihilated in a sidewall or inside of the through-silicon-via 301, therefore the second epitaxial layer 5 with a low dislocation density is formed, which improves a quality of the second epitaxial layer 5, thereby improving a withstand voltage performance of the semiconductor device and avoiding a leakage current phenomenon.

Each step of this embodiment is described in detail below.

At step S100, the silicon substrate is provided, and the first epitaxial layer disposed on the support substrate is provided.

Figure 2:
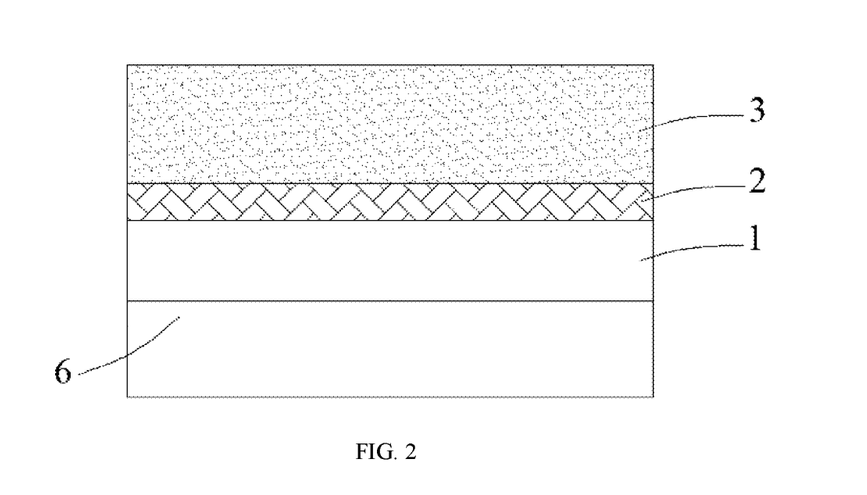
FIG. 2 is a schematic diagram of a structure obtained after a completion of step 110 in the method of manufacturing the semiconductor structure according to the first embodiment of the present disclosure.

As shown in FIG. 2, a material of the first epitaxial layer 1 can include at least one of GaN, AlN, AlGaN, InGaN, or AlInGaN. The silicon substrate 3 can include monocrystalline silicon with <100> orientation, but this is not particularly limited in the embodiment of the present disclosure. The support substrate 6 can include a silicon carbide substrate, a sapphire substrate, or a gallium nitride substrate, but is not limited thereto. A material of the support substrate 6 can also include silicon.

At step S110, the first epitaxial layer and the silicon substrate are bonded through the bonding layer.

As shown in FIG. 2, a material of the bonding layer 2 can include a silicon dioxide, silicon nitride, metal or the like, but the present disclosure is not limited to this. In a case that the bonding layer 2 is thicker, a depth-to-width ratio of a through-silicon-via 301 (see FIG. 3) can be increased to further improve a probability of dislocation annihilation. In an embodiment of the present disclosure, step S110 can include: forming a bonding layer 2 on the first epitaxial layer 1 or the silicon substrate 3, and using the bonding layer 2 as a contact layer to bond the first epitaxial layer 1 and the silicon substrate 3 together. The bonding layer 2 is only formed on one of the first epitaxial layer 1 or the silicon substrate 3, for example, the bonding layer 2 is formed on the first epitaxial layer 1 and is not formed on the silicon substrate 3, or the bonding layer 2 is formed on the silicon substrate 3 and is not formed on the first epitaxial layer 1.

In another embodiment of the present disclosure, step S110 can include: forming a first bonding layer on a surface of the first epitaxial layer 1; forming a second bonding layer on a surface of the silicon substrate 3; using the first bonding layer and the second bonding layer as contact layers to bond the first epitaxial layer 1 and the silicon substrate 3 together. Both the first bonding layer and the second bonding layer can be prepared by a deposition process, but the embodiment of the present disclosure is not limited thereto. The first bonding layer and the second bonding layer are in contact with each other and constitute the bonding layer 2.

In yet another embodiment of the present disclosure, the bonding layer 2 can also be provided separately, for example, the bonding layer 2 is not formed on any one of the first epitaxial layer 1 and the silicon substrate 3.

At step S120, the through-silicon-via is formed on the silicon substrate, the first through-hole exposing the first epitaxial layer is formed on the bonding layer, and the first through-hole is communicated with the through-silicon-via.

As shown in FIG. 3, the through-silicon-via 301 can be formed by a patterning process, such as a photolithography process. The through-silicon-via 301 penetrates the silicon substrate 3 in a thickness direction of the silicon substrate 3. The through-silicon-via 301 can include a circular hole, a regular polygon hole, a special-shaped hole, or the like. A number of the through-silicon-via 301 include one, two, three or more. A depth-to-width ratio of the through-silicon-via 301 can be greater than 1.

As shown in FIG. 3, the first through-hole 201 can be formed by a patterning process, such as a photolithography process. The first through-hole 201 penetrates the bonding layer 2 in a thickness direction of the bonding layer 2. The first through-hole 201 can include a circular hole, a regular polygon hole, a special-shaped hole, or the like. A number of the first through-hole 201 can include one, two, three or more.

As shown in FIG. 3, the through-silicon-via 301 communicates with the first through-hole 201. Taking a plurality of through-silicon-vias 301 and a plurality of first through-holes 201 as an example, the plurality of through-silicon-vias 301 are communicated with the plurality of first through-holes 201 one by one. Each through-silicon-via 301 can have a same shape as a corresponding first through-hole 201. Each through-silicon-via 301 can have a same size as the corresponding first through-hole 201. An orthographic projection of each through-silicon-via 301 on the first epitaxial layer 1 can completely coincide with an orthographic projection of the corresponding first through-hole 201 on the first epitaxial layer 1. Each through-silicon-via 301 and the corresponding first through-hole 201 can be formed through a single patterning process, but the embodiment of the present disclosure does not limit this in particular.

At step S130, a second epitaxial layer is formed on the first epitaxial layer exposed by the first through-hole.

Figure 4:
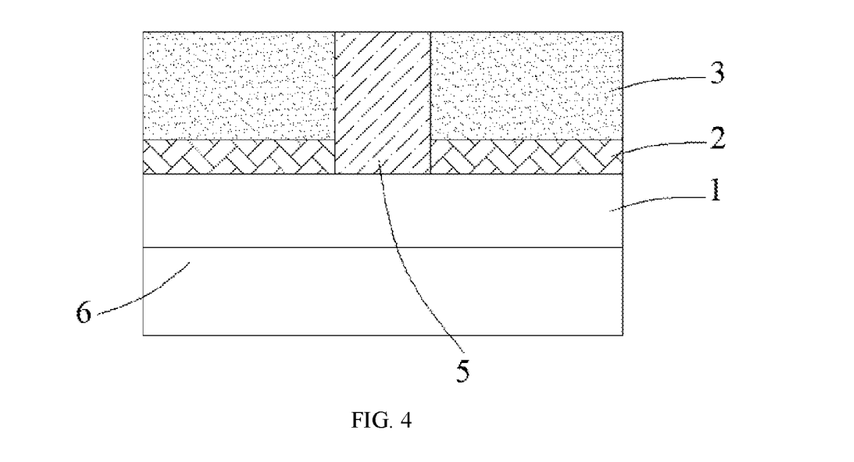
FIG. 4 is a schematic diagram of a structure obtained after a completion of step 130 in the method of manufacturing the semiconductor structure according to the first embodiment of the present disclosure.

As shown in FIG. 4, a material of the second epitaxial layer 5 can include at least one of GaN, AlN, AlGaN, InGaN, or AlInGaN. The material of the second epitaxial layer 5 can be same as or different from the material of the first epitaxial layer 1. In addition, the second epitaxial layer 5 can be doped with silicon (Si) ions, germanium (Ge) ions, tin (Sn) ions, selenium (Se) ions, tellurium (Te) ions, magnesium (Mg) ions, zinc (Zn) ions, calcium (Ca) ions, strontium (Sr) ions or barium (Ba) ions. The second epitaxial layer 5 can include a lightly doped epitaxial layer. A doping concentration of the second epitaxial layer 5 can be less than a doping concentration of the first epitaxial layer 1. The second epitaxial layer 5 can fill the first through-hole 201 and through-silicon-via 301, and a surface of the second epitaxial layer 5 away from the first epitaxial layer 1 is flush with a surface of the silicon substrate 3 away from the bonding layer 2. Since the depth-to-width ratio of the through-silicon-via 301 is greater than 1, dislocations grown in the second epitaxial layer 5 of the through-silicon-via 301 can be stopped at an inside or a sidewall of the through-silicon-via 301, thereby improving a quality of the second epitaxial layer 5.

At step S140, the support substrate is removed, and a first electrode is formed on a side of the first epitaxial layer away from the bonding layer, and the first electrode is electrically coupled with the first epitaxial layer.

Figure 5:
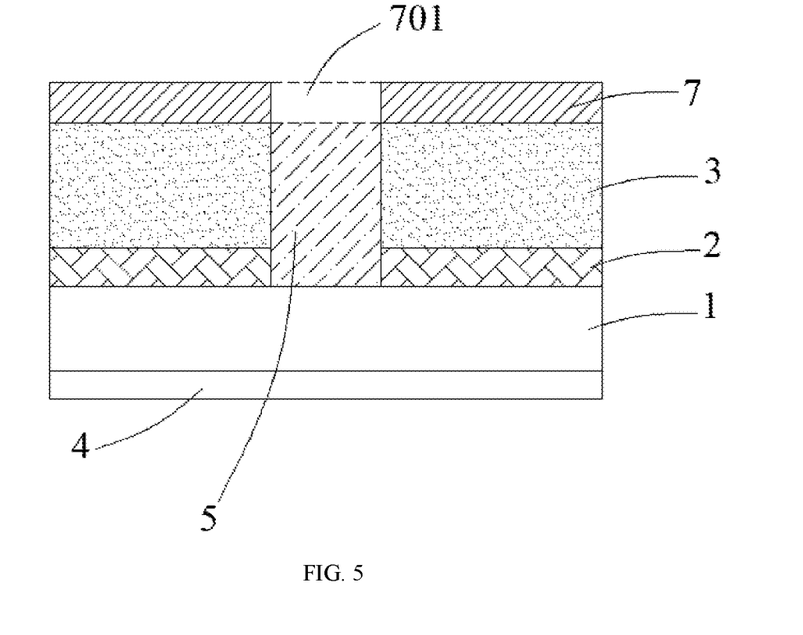
FIG. 5 is a schematic diagram of a structure obtained after a completion of step 140 in the method of manufacturing the semiconductor structure according to the first embodiment of the present disclosure.

As shown in FIG. 5, the first electrode 4 can include an ohmic contact electrode. A material of the ohmic contact electrode can include titanium (Ti), platinum (Pt), or *aurum* (Au), but the embodiment of the present disclosure is not limited thereto.

At step S150, a second electrode is formed on a side of the second epitaxial layer away from the first epitaxial layer, and the second electrode is electrically coupled with the second epitaxial layer.

As shown in FIG. 5, before forming the second electrode 8 (see FIG. 6), the method of manufacturing the semiconductor structure according to the first embodiment of the present disclosure can further include: forming a first dielectric layer 7 on a side of the silicon substrate 3 away from the bonding layer 2. A material of the first dielectric layer 7 can include a silicon dioxide, a silicon nitride or the like. The first dielectric layer 7 can be provided with a second through-hole 701 communicating with the through silicon hole 301. The second through-hole 701 can be formed by a patterning process, such as a photolithography process. The second through-hole 701 penetrates the first dielectric layer 7 in a thickness direction of the first dielectric layer 7. The second through-hole 701 can include a circular hole, a rectangular hole or the like. A number of the second through-holes 701 can include one, two, three or more. The first dielectric layer 7 can be formed before the support substrate 6 is removed, and the first dielectric layer 7 can also be formed after the support substrate 6 is removed. As shown in FIG. 6, the second electrode 8 can include a Schottky contact electrode. A partial area of the second electrode 8 covers the first dielectric layer 7, and the second electrode 8 passes through the second through-hole 701 to contact the second epitaxial layer 5. A material of the second electrode 8 can include platinum (Pt), or aurum (Au), but the embodiment of the present disclosure is not limited thereto.

The semiconductor structure of the first embodiment of the present disclosure can be manufactured by the above-mentioned method of manufacturing the semiconductor structure. As shown in FIG. 2 to FIG. 6, the semiconductor structure can include the first epitaxial layer 1, the bonding layer 2, the silicon substrate 3, the second epitaxial layer 5, the first electrode 4 and the second electrode 8.

The bonding layer 2 is disposed on the first epitaxial layer 1 and has a first through-hole 201 exposing the first epitaxial layer 1. The silicon substrate 3 is disposed on a side of the bonding layer 2 away from the first epitaxial layer 1, and the first epitaxial layer 1 and the silicon substrate 3 are bonded through the bonding layer 2. The silicon substrate 3 is provided with a through-silicon-via 301, and the through-silicon-via 301 communicates with the first through-holes 201. The second epitaxial layer 5 is disposed on the first epitaxial layer 1 exposed by the first through-hole 201. The first electrode 4 is disposed on a side of the first epitaxial layer 1 away from the bonding layer 2 and is electrically coupled with the first epitaxial layer 1. The second electrode 8 is disposed on a side of the second epitaxial layer 5 away from the first epitaxial layer 1 and is electrically coupled with the second epitaxial layer 5.

The method of manufacturing the semiconductor structure and the semiconductor structure provided in the first embodiment of the present disclosure belong to a same inventive concept, and the description of the relevant details and beneficial effects can be referred to each other and will not be repeated here.

Second Embodiment

Figure 7:
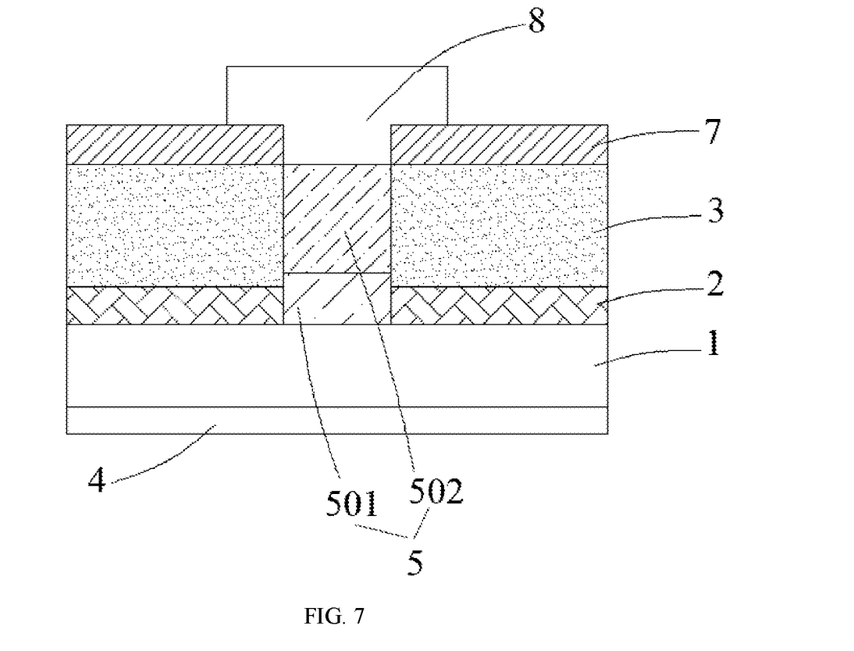
FIG. 7 is a schematic diagram of a semiconductor structure according to a second embodiment of the present disclosure.

A semiconductor structure and a method of manufacturing the semiconductor structure in the second embodiment of the present disclosure are substantially the same as the semiconductor structure and the method of manufacturing the semiconductor structure in the first embodiment of the present disclosure, except that: as shown in FIG. 3 and FIG. 7, the second epitaxial layer 5 includes a heavily doped layer 501 and a lightly doped layer 502 in the second embodiment of the present disclosure. The heavily doped layer 501 can be disposed on the first epitaxial layer 1 exposed by the first through-hole 201, and a doping concentration of the heavily doped layer 501 is less than or equal to a doping concentration of the first epitaxial layer 1. The lightly doped layer 502 can be disposed on a side of the heavily doped layer 501 away from the first epitaxial layer 1, and a doping concentration of the lightly doped layer 502 is less than the doping concentration of the heavily doped layer 501.

Third Embodiment

Figure 8:
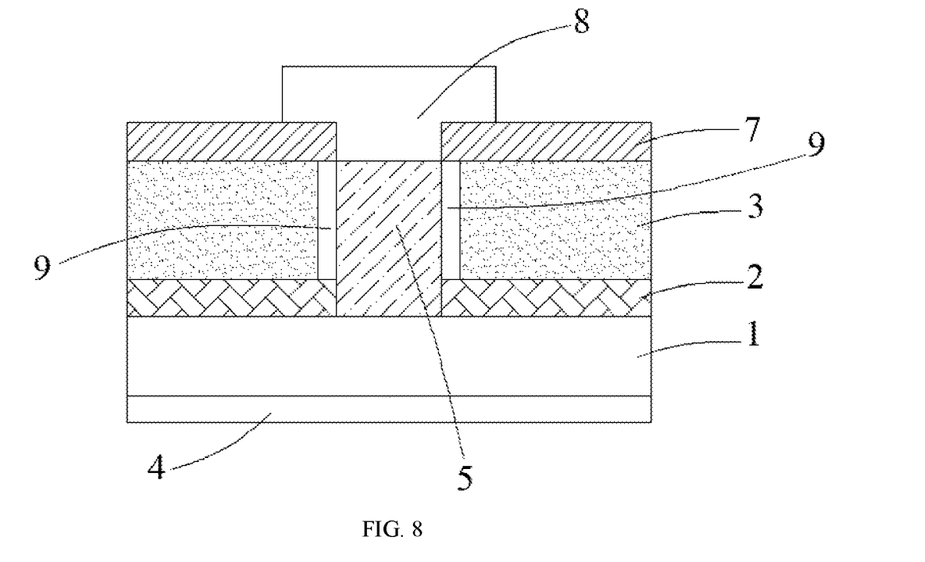
FIG. 8 is a schematic diagram of a semiconductor structure according to a third embodiment of the present disclosure.

A semiconductor structure and a method of manufacturing the semiconductor structure in the third embodiment of the present disclosure are substantially the same as the semiconductor structure and the method of manufacturing the semiconductor structure in the first or second embodiment of the present disclosure, except that: as shown in FIG. 3 and FIG. 8, a sidewall of the through-silicon-via 301 has a second dielectric layer 9. A material of the second dielectric layer 9 can include a silicon dioxide or a silicon nitride. A step of forming the second dielectric layer 9 is performed after the through-silicon-via 301 is formed. In the embodiment of the present disclosure, the second dielectric layer 9 can be formed by thermal oxidation processes. The second dielectric layer 9 can also be formed by other processes, such as deposition processes. For example, forming the second dielectric layer 9 can include: after forming the through-silicon-via 301, forming a photoresist layer on the first epitaxial layer 1 exposed by the through-silicon-via 301; forming a dielectric material layer covering a sidewall of through-silicon-via 301 and the photoresist layer; removing the photoresist layer and removing the dielectric material layer on the photoresist layer, where a portion of the dielectric material layer covering a sidewall of the through-silicon-via 301 forms the second dielectric layer 9. If the second dielectric layer 9 is formed by the thermal oxidation processes, the step of forming the first through-hole 201 is to be performed after the second dielectric layer 9 is formed. The sidewall of the through-silicon-via 301 in the third embodiment of the present disclosure has the second dielectric layer 9, which can avoid secondary melting of the silicon substrate 3.

The above descriptions are embodiments of the present disclosure, and do not limit the present disclosure in any form. Although the present disclosure has been disclosed as above in the embodiments, it is not intended to limit the present disclosure. Those skilled in the art without departing from the scope of the technical solution of the present disclosure, can make some changes or modifications by using the above disclosed technical content and these changes or modifications belong to the equivalent embodiment of the same change. Any simple modifications, equivalent changes and modifications made to the above embodiments according to the technical essence of the disclosure without departing from the technical scheme of the disclosure still fall within the scope of the technical scheme of the disclosure.

The invention claimed is:

1. A semiconductor structure, comprising:
    a first epitaxial layer;
    a bonding layer, disposed on the first epitaxial layer, and provided with a first through-hole exposing the first epitaxial layer;
    a silicon substrate, disposed on a side of the bonding layer away from the first epitaxial layer, the first epitaxial layer and the silicon substrate being bonded through the bonding layer;
    a through-silicon-via in the silicon substrate, the through-silicon-via communicating with the first through-hole;
    a second epitaxial layer, disposed on the first epitaxial layer exposed by the first through-hole;
    a first electrode, disposed on a side of the first epitaxial layer away from the bonding layer, and electrically coupled with the first epitaxial layer; and
    a second electrode, disposed on a side of the second epitaxial layer away from the first epitaxial layer, and electrically coupled with the second epitaxial layer;
    wherein the first through-hole and the through-silicon-via are fully filled with the second epitaxial layer, and a surface of the second epitaxial layer away from the first epitaxial layer is flush with a surface of the silicon substrate away from the bonding layer.

2. The semiconductor structure of claim 1, wherein the second epitaxial layer is a doped epitaxial layer, and a doping concentration of the second epitaxial layer is less than a doping concentration of the first epitaxial layer.

3. The semiconductor structure of claim 2, wherein the first electrode is an ohmic contact electrode, and the second electrode is a Schottky contact electrode.

4. The semiconductor structure of claim 1, wherein the second epitaxial layer comprises:
    a first doped layer, disposed on the first epitaxial layer exposed by the first through-hole, a doping concentration of the first doped layer being less than or equal to a doping concentration of the first epitaxial layer; and
a second doped layer, disposed on a side of the first doped layer away from the first epitaxial layer, a doping concentration of the second doped layer being less than the doping concentration of the first doped layer.

5. The semiconductor structure of claim 1, wherein a depth-to-width ratio of the through-silicon-via is greater than 1.

6. The semiconductor structure of claim 1, wherein the silicon substrate is monocrystalline silicon with <100> orientation.

7. The semiconductor structure of claim 1, wherein a material of the first epitaxial layer is same as a material of the second epitaxial layer, and comprises at least one of GaN, AlN, AlGaN, InGaN, or AlInGaN.

8. The semiconductor structure of claim 1, further comprising:
a first dielectric layer, disposed on a side of the silicon substrate away from the bonding layer, and provided with a second through-hole communicating with the through-silicon-via, wherein a partial area of the second electrode covers the first dielectric layer, and the second electrode passes through the second through-hole to contact the second epitaxial layer.

9. The semiconductor structure of claim 1, wherein a sidewall of the through-silicon-via has a second dielectric layer.

10. A method of manufacturing a semiconductor structure, comprising:
providing a silicon substrate, and providing a first epitaxial layer disposed on a support substrate;
providing a bonding layer to bond the first epitaxial layer and the silicon substrate together;
forming a through-silicon-via on the silicon substrate, forming a first through-hole exposing the first epitaxial layer on the bonding layer, the first through-hole communicating with the through-silicon-via;
forming a second epitaxial layer on the first epitaxial layer exposed by the first through-hole;
removing the support substrate, forming a first electrode on a side of the first epitaxial layer away from the bonding layer, the first electrode being electrically coupled on the first epitaxial layer; and
forming a second electrode on a side of the second epitaxial layer away from the first epitaxial layer, the second electrode being electrically coupled with the second epitaxial layer.

11. The method of manufacturing the semiconductor structure of claim 10, wherein the second epitaxial layer comprises a doped epitaxial layer, and a doping concentration of the second epitaxial layer-is less than a doping concentration of the first epitaxial layer.

12. The method of manufacturing the semiconductor structure of claim 10, wherein forming the second epitaxial layer comprises:

forming a first doped layer on the first epitaxial layer exposed by the first through-hole, a doping concentration of the first doped layer being less than or equal to a doping concentration of the first epitaxial layer; and
forming a second doped layer on a side of the first doped layer away from the first epitaxial layer, a doping concentration of the second doped layer being less than the doping concentration of the first doped layer.

13. The method of manufacturing the semiconductor structure of claim 10, wherein a depth-to-width ratio of the through-silicon-via-is greater than 1.

14. The method of manufacturing the semiconductor structure of claim 10, before forming the second electrode, the method of manufacturing the semiconductor structure further comprises:
forming a first dielectric layer-on a side of the silicon substrate-away from the bonding layer, and the first dielectric layer being provided with a second through-hole communicating with the through-silicon-via, wherein a partial area of the second electrode-covers the first dielectric layer, and the second electrode passes through the second through-hole-to contact the second epitaxial layer.

15. The method of manufacturing the semiconductor structure of claim 10, further comprising:
fully filling the first through-hole and the through-silicon-via with the second epitaxial layer, wherein a surface of the second epitaxial layer away from the first epitaxial layer is flush with a surface of the silicon substrate away from the bonding layer.

16. The method of manufacturing the semiconductor structure of claim 10, further comprising:
after forming the through-silicon-via, forming a second dielectric layer on a sidewall of the through-silicon-via.

17. The method of manufacturing the semiconductor structure of claim 10, further comprising:
after forming the through-silicon-via, forming a photoresist layer on the first epitaxial layer exposed by the through-silicon-via;
forming a dielectric material layer covering a sidewall of through-silicon-via and the photoresist layer; and
removing the photoresist layer and removing the dielectric material layer on the photoresist layer, wherein a portion of the dielectric material layer covering a sidewall of the through-silicon-via forms a second dielectric layer.

18. The method of manufacturing the semiconductor structure of claim 10, wherein a material of the first epitaxial layer is same as a material of the second epitaxial layer, and comprises at least one of GaN, AlN, AlGaN, InGaN, or AlInGaN.

19. The method of manufacturing the semiconductor structure of claim 10, wherein he silicon substrate is monocrystalline silicon with <100> orientation.

* * * * *